(12) United States Patent
Zhang et al.

(10) Patent No.: US 11,696,403 B2
(45) Date of Patent: Jul. 4, 2023

(54) DISPLAY DEVICE AND ELECTRONIC APPARATUS

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Peng Zhang, Beijing (CN); Sijun Lei, Beijing (CN); Xianyong Gao, Beijing (CN); Yansheng Sun, Beijing (CN); Yunsong Li, Beijing (CN); Xinzhi Shao, Beijing (CN); Dengqian Li, Beijing (CN); Shanbin Chen, Beijing (CN); Jia Sun, Beijing (CN); Guangzhao Li, Beijing (CN); Bo Ran, Beijing (CN); Zhicai Xu, Beijing (CN); Bichao Chen, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 485 days.

(21) Appl. No.: 16/956,751

(22) PCT Filed: Aug. 7, 2019

(86) PCT No.: PCT/CN2019/099656
§ 371 (c)(1),
(2) Date: Jun. 22, 2020

(87) PCT Pub. No.: WO2021/022522
PCT Pub. Date: Feb. 11, 2021

(65) Prior Publication Data
US 2022/0394852 A1    Dec. 8, 2022

(51) Int. Cl.
*H05K 1/18* (2006.01)
*H05K 1/14* (2006.01)
(Continued)

(52) U.S. Cl.
CPC ............. *H05K 1/14* (2013.01); *G06F 1/1616* (2013.01); *H05K 1/028* (2013.01); *H05K 2201/10128* (2013.01)

(58) Field of Classification Search
CPC ................. H05K 1/14; H05K 1/028; H05K 2201/10128; G06F 1/1616
See application file for complete search history.

(56) References Cited

U.S. PATENT DOCUMENTS 8,493,321 B2    7/2013  Sakata et al.
10,595,109 B2 *  3/2020  Shin ............... G06F 1/1688
(Continued)

FOREIGN PATENT DOCUMENTS

CN    101261788 A    9/2008
CN    106932982 A    7/2017
(Continued)

*Primary Examiner* — Binh B Tran
(74) *Attorney, Agent, or Firm* — Dilworth & Barrese, LLP.; Michael J. Musella, Esq.

(57) ABSTRACT

A display device and an electronic apparatus. The display device includes a display panel, a first circuit board and a second circuit board. The display panel includes a light-outgoing side and a non-light-outgoing side opposite to the light-outgoing side; the first circuit board is electrically connected to the display panel and positioned at the non-light-outgoing side; and the second circuit board is configured to be electrically connected to the first circuit board, and the second circuit board includes a functional circuit in signal connection with the display panel.

16 Claims, 4 Drawing Sheets

(51) Int. Cl.
*G06F 1/16* (2006.01)
*H05K 1/02* (2006.01)

(56) References Cited

U.S. PATENT DOCUMENTS

| | | | |
|---|---|---|---|
| 2003/0021085 A1 | 1/2003 | Landry et al. | |
| 2016/0128194 A1* | 5/2016 | Hong | H05K 1/147 361/749 |
| 2020/0068733 A1* | 2/2020 | Lee | H05K 1/147 |
| 2021/0045229 A1* | 2/2021 | Lim | H01L 23/4985 |

FOREIGN PATENT DOCUMENTS

| | | |
|---|---|---|
| CN | 107942580 A | 4/2018 |
| CN | 108458285 A | 8/2018 |
| CN | 108682369 A | 10/2018 |
| CN | 207965416 U | 10/2018 |
| CN | 109922412 A | 6/2019 |

\* cited by examiner

DISPLAY DEVICE AND ELECTRONIC APPARATUS

TECHNICAL FIELD

Embodiments of the present disclosure relate to a display device and an electronic apparatus.

BACKGROUND

Narrow bezel is a development trend of display devices. However, no satisfactory solution is currently available. Some display devices may achieve narrow bezel, however, at the same time, the thickness of these display devices is generally increased.

SUMMARY

At least one embodiment of the present disclosure provides a display device, which includes:
a display panel, including a light-outgoing side and a non-light-outgoing side opposite to the light-outgoing side;
a first circuit board, electrically connected to the display panel and positioned at the non-light-outgoing side; and
a second circuit board, configured to be electrically connected to the first circuit board, and the second circuit board including a functional circuit in signal connection with the display panel.

For example, in the display device according to at least one embodiment of the present disclosure, the first circuit board is configured to provide only an electrical connection between the display panel and the second circuit board and to have no signal processing capability.

For example, in the display device according to at least one embodiment of the present disclosure, the display device includes a backlight and a drive circuit, and at least one selected from a group consisting of the backlight and the drive circuit of the display device is electrically connected to the first circuit board.

For example, the display device according to at least one embodiment of the present disclosure further includes a flexible printed circuit board configured to electrically connect the first circuit board to at least one selected from a group consisting of:
the display panel; and
the second circuit board.

For example, in the display device according to at least one embodiment of the present disclosure, at least one selected from a group consisting of the first circuit board and the second circuit board is a non-flexible circuit board.

For example, in the display device according to at least one embodiment of the present disclosure, the flexible printed circuit board includes a first flexible printed circuit board, the first flexible printed circuit board includes a first sub-flexible printed circuit board and a second sub-flexible printed circuit board,
the first sub-flexible printed circuit board is configured to electrically connect a backlight of the display panel to the first circuit board, and
the second sub-flexible printed circuit board is configured to electrically connect a drive circuit of the display panel to the first circuit board.

For example, in the display device according to at least one embodiment of the present disclosure, the flexible printed circuit board further includes a second flexible printed circuit board configured to electrically connect the first circuit board to the second circuit board,
the second flexible printed circuit board includes a snap-on connector and the second circuit board comprises a socket, and
the snap-on connector mates with the socket to electrically connect the first circuit board to the second circuit board.

For example, in the display device according to at least one embodiment of the present disclosure, the flexible printed circuit board further includes a second flexible printed circuit board configured to electrically connect the first circuit board to the second circuit board, and
the display device further includes a rigid-flex board configured to electrically connect the second circuit board to the second flexible printed circuit.

For example, in the display device according to at least one embodiment of the present disclosure, the first circuit board includes a first wire and a second wire, the first wire and the second wire are configured to be connected between the first sub-flexible printed circuit board and the second flexible printed circuit board, and the first wire and the second wire are a power supply wire and a signal transmission wire for a backlight of the display panel respectively,
the first circuit board further includes a third wire and a fourth wire, the third wire and the fourth wire are configured to be connected between the second sub-flexible printed circuit board and the second flexible printed circuit board, and
the display panel includes a fifth wire and a sixth wire, the fifth wire and the sixth wire are configured to be connected between the second sub-flexible printed circuit board and the drive circuit of the display panel, the third wire and the fifth wire are power supply wires for the drive circuit of the display panel, and the fourth and sixth wires are signal transmission wires for the drive circuit of the display panel.

For example, in the display device according to at least one embodiment of the present disclosure, the first circuit board is a non-flexible circuit board having a thickness less than 1 mm.

For example, in the display device according to at least one embodiment of the present disclosure, the first circuit board is a non-flexible circuit board having a multi-layer structure.

For example, in the display device according to at least one embodiment of the present disclosure, the functional circuit includes at least one selected from a group consisting of an interface circuit, a power circuit and a signal processing circuit.

At least one embodiment of the present disclosure further provides an electronic apparatus, which includes the display device according to any one of the embodiments of the present disclosure.

For example, in the electronic apparatus according to at least one embodiment of the present disclosure, the electronic apparatus includes a first main body and a second main body connected to each other, and
the first circuit board is in the first main body, and the second circuit board is in the second main body.

For example, in the electronic apparatus according to at least one embodiment of the present disclosure, the first main body and the second main body are pivotably connected.

For example, the electronic apparatus according to at least one embodiment of the present disclosure further includes a connection part hinged to at least one selected from a group consisting of the first main body and the second main body, the first circuit board and the second circuit board being connected to each other via the connection part.

For example, in the electronic apparatus according to at least one embodiment of the present disclosure, the electronic apparatus is a notebook computer, the display device functions as a display screen of the notebook computer, and the second circuit board is inside a host casing of the notebook computer and laminated with a keyboard of the notebook computer.

At least one embodiment of the present disclosure further provides a method of manufacturing the display device according to any one of the embodiments of the present disclosure, which includes:

electrically connecting the display panel to the first circuit board and positioning the first circuit board at the non-light-outgoing side; and electrically connecting the first circuit board to the second circuit board.

At least one embodiment of the present disclosure further provides a method of operating the display device according to any one of the embodiments of the present disclosure, which includes: transferring signals between the functional circuit of the second circuit board and the display panel via the first circuit board.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

As described above, current design approaches for narrow bezel are unsatisfactory. Some display devices achieve narrow bezel, while the thickness of these display devices are relatively great.

At least one embodiment of the present disclosure provides a display device capable of narrowing the bezel of the display device without increasing the thickness of the display device, thereby achieving an ultra-thin and ultra-narrow design of the display device.

Figure 1:
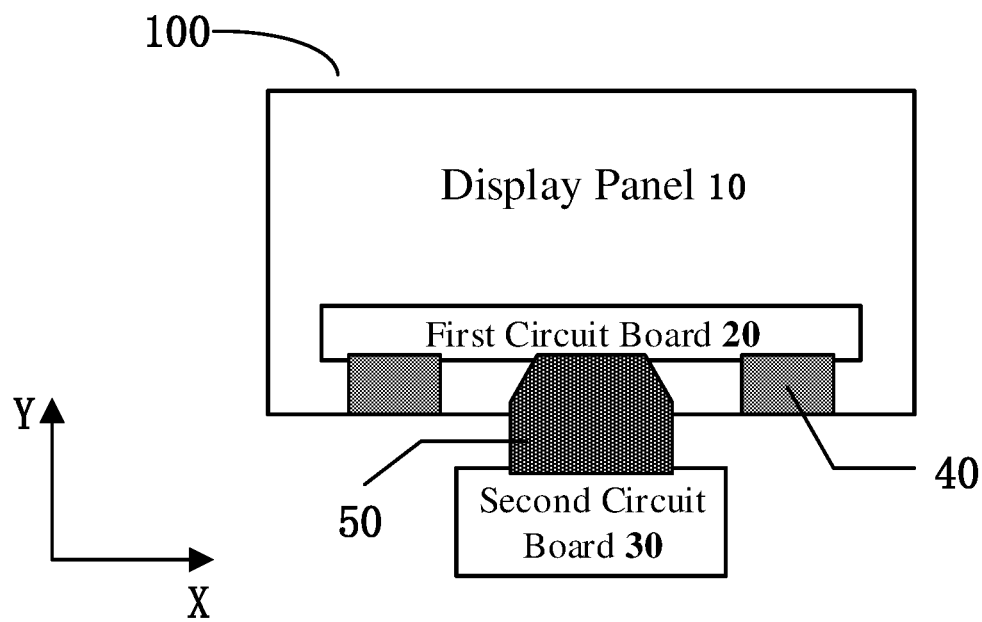
FIG. 1 is a schematic structural diagram of a display device according to at least one embodiment of the present disclosure.

FIG. 1 is a schematic structural diagram of a display device according to at least one embodiment of the present disclosure. As shown in FIG. 1, a display device 100 according to at least one embodiment of the present disclosure includes a display panel 10, a first circuit board 20, and a second circuit board 30. The display panel 10 includes a light-outgoing side and a non-light-outgoing side opposite to the light-outgoing side. The light-outgoing side refers to the side where an image is displayed to a user when the display panel 10 is in use, i.e. a display side. FIG. 1 schematically shows the non-light-outgoing side of the display panel 10. The first circuit board 20 is electrically connected to the display panel 10 and is positioned at the non-light-outgoing side of the display panel 10. In some embodiments, a projection of the first circuit board 20 on a plane where the display panel 10 is located is at least partially overlapped with a region where the display panel 10 is located. For example, the projection of the first circuit board 20 on the plane where the display panel 10 is located falls within the range of the display panel 10. The second circuit board 30 is configured to be electrically connected to the first circuit board 20, and the second circuit board 30 includes a functional circuit in signal connection with the display panel 10.

It should be noted that FIG. 1 only schematically shows one first circuit board 20 and one second circuit board 30. However, in other embodiments, the display device 100 may further include other numbers of first and second circuit boards 20 and 30 according to actual requirements, and the number of the first and second circuit boards 20 and 30 included in the display device 100 is not limited by the embodiments of the present disclosure.

In some embodiments, the display panel 10 may be, for example, a liquid crystal panel, an organic light emitting diode (OLED) display panel, a quantum dot light emitting diode (QLED) display panel, an electronic paper panel, or the like. The display panel 10 may have any size and be of any type, and embodiments of the present disclosure are not limited thereto. For example, in some embodiments, the display panel 10 may be a twisted nematic (TN) liquid crystal panel, an advanced super dimension switch (ADS) liquid crystal panel, an in-plane switching (IPS) liquid crystal panel, a vertical alignment (VA) liquid crystal panel, an active matrix organic light emitting diode (AMOLED) display panel, a passive matrix organic light emitting diode (PMOLED) display panel, or the like. For example, in some embodiments, the display panel 10 may have a size of 0.2 inches, 1 inch, 10 inches, 32 inches, 55 inches, 110 inches, or the like.

In some embodiments, the first circuit board 20 has a thickness less than 1 mm. For example, the first circuit board 20 may have a thickness less than or equal to 0.9 mm, 0.8 mm, 0.7 mm, 0.6 mm, 0.5 mm, 0.44 mm, or the like. In some embodiments, the first circuit board 20 may also have a width less than 5 mm. For example, the first circuit board 20 may have a width less than or equal to 4 mm, 3 mm, or the like. Further, it should be understood that the width mentioned here refers to the shorter one of an extension distance of the first circuit board 20 in X direction in FIG. 1 and an extension distance of the first circuit board 20 in Y direction in FIG. 1. In FIG. 1, the width of the first circuit board 20 is the extension distance in the Y direction in FIG. 1. The above-mentioned size of the first circuit board 20 (specifically, the thickness of the first circuit board 20) minimizes an influence on the thickness of the display device 100 when the first circuit board 20 is disposed on the non-light-outgoing side of the display panel 10.

In some embodiments, the first circuit board 20 may be configured to provide only electrical connection between the display panel 10 and the second circuit board 30 to transfer signals (e.g., data signals, control signals, timing signals, or the like) or power, without any signal processing capability, i.e., the first circuit board 20 may not have any signal processing circuit, interface circuit and power circuit thereon. For example, the first circuit board 20 may be implemented as a flexible flat cable (FFC) known in the art, which may be of any suitable type, which is not limited in the embodiments of the present disclosure.

In some other embodiments, the first circuit board 20 may also have a signal processing circuit formed thereon, in addition to providing the electrical connection for transferring signals or power, as long as the first circuit board 20 may meet the above-mentioned size requirements, such as the above-mentioned thickness requirement.

The electrical connection provided by the first circuit board 20 for the display panel 10 and the second circuit board 30 may provide at least one of the following between the display panel 10 and the second circuit board 30: power supply wires and signal transmission wires.

In some embodiments, in use, the second circuit board 30 may be disposed outside the display panel 10. That is, the projection of the second circuit board 30 on the plane where the display panel 10 is located is not overlapped with the region where the display panel 10 is located. However, it should be understood that embodiments of the present disclosure are not limited thereto. In some other embodiments, in use, according to actual requirements, the projection of the second circuit board 30 on the plane where the display panel 10 is located may also be at least partially overlapped with the region where the display panel 10 is located.

The functional circuit of the second circuit board 30 in signal connection with the display panel 10 may include at least one of the interface circuit, power circuit and signal processing circuit.

The above-mentioned interface circuit may be configured, for example, to receive signals from a system (e.g., a motherboard of a complete machine), input digital signals of the received signals to a signal processing circuit (e.g., a timing control circuit), and input power signals of the received signals to a power circuit. The interface circuit may, for example, include at least one of TTL (Transistor Transistor logic) interface, TMDS (Transition Minimized Differential signaling) interface, LVDS (Low Voltage Differential signaling) interface, or the like. However, it should be understood that embodiments of the present disclosure are not limited thereto.

The above-mentioned power circuit may include, for example, at least one of an LDO (Low Dropout Voltage Regulator) circuit, Boost converter, Positive Charge Pump, Negative Charge Pump, voltage divider circuit, or the like. However, it should be understood that embodiments of the present disclosure are not limited thereto. In some embodiments, the power circuit may also employ a power management chip (PMIC).

The above-mentioned signal processing circuit may include a timing control circuit, a gray scale circuit, or the like. For example, the timing control circuit may provide control signals to a scan drive circuit and a data drive circuit of the display panel 10, and the gray scale circuit may provide a Gamma reference voltage to the data drive circuit of the display panel 10. For example, in some embodiments of the present disclosure, the timing control circuit may employ a Timing Controller (TCON). However, it should be understood that the embodiments of the present disclosure are not limited thereto, and in other embodiments, the signal processing circuit of the second circuit board 30 may also include circuits for implementing other functions according to actual requirements.

The parameters of the second circuit board 30, such as size and the number of layers, may be determined according to actual requirements, which is not limited in the embodiments of the present disclosure.

In some embodiments, the display device 100 may further include a flexible printed circuit board configured to electrically connect the first circuit board 20 to at least one of a display panel 10 and a second circuit board 30. For example, in some embodiments, the flexible printed circuit board may include at least one of the first flexible printed circuit board 40 and the second flexible printed circuit board 50. Although FIG. 1 shows the first and second flexible printed circuit board 40 and 50, it should be understood that in other embodiments, the display device 100 may not include the first flexible printed circuit board 40, or not include the second flexible printed circuit board 50, or include neither of them, and embodiments of the present disclosure are not limited thereto.

In some embodiments, the first circuit board 20 may be electrically connected to the display panel 10 through the first flexible printed circuit 40. However, it should be understood that embodiments of the present disclosure are not limited thereto. For example, in some embodiments, the first circuit board 20 may be electrically connected to the display panel 10 by wires. Although it is shown in FIG. 1 that the first circuit board 20 is electrically connected to the display panel 10 by two first flexible printed circuits 40, it should be understood that the first circuit board 20 may also be electrically connected to the display panel 10 by one first flexible printed circuits 40 or three or more first flexible printed circuits 40 to establish the signal connection, or the like, with the display panel 10, and the embodiments of the present disclosure are not limited thereto.

In some embodiments, the first flexible printed circuit 40 may be connected to the non-light-outgoing side of the display panel 10, and the first flexible printed circuit 40 may be connected to a side of the first circuit board 20 away from the display panel 10 and the first circuit board 20 is positioned at the non-light-outgoing side of the display panel 10. However, it should be understood that embodiments of the present disclosure are not limited thereto. For example, in some other embodiments, the first flexible printed circuit 40 may also be connected to the light-outgoing side or a side surface of the display panel 10, and the first flexible printed circuit 40 may be connected to a side of the first circuit board 20 facing the display panel 10 or a side surface of the first circuit board 20, and the first circuit board 20 is positioned at the non-light-outgoing side of the display panel 10. The first flexible printed circuit board 40 may be connected or adhered to the first circuit board 20 and the display panel 10 by means of bonding or an anisotropic conductive adhesive, for example.

In some embodiments, the first circuit board 20 may be electrically connected to the second circuit board 30 by the second flexible printed circuit 50. However, it should be understood that embodiments of the present disclosure are not limited thereto. For example, in some embodiments, the first circuit board 20 may be electrically connected to the second circuit board 30 by wires. Although it is shown in FIG. 1 that the first circuit board 20 is electrically connected to the second circuit board 30 by one second flexible printed circuit 50, it should be understood that the first circuit board 20 may also be electrically connected to the second circuit board 30 by two or more second flexible printed circuits 50, which is not limited in the embodiments of the present disclosure. Similar to the above, in some embodiments, the second flexible printed circuit 50 may be connected or adhered to the first and second circuit boards 20 and 30 by means of bonding or an anisotropic conductive adhesive.

For example, the second flexible printed circuit 50 may also be connected to a side of the first circuit board 20 away from the display panel 10, a side of the first circuit board 20 facing the display panel 10, or a side surface of the first circuit board 20, and embodiments of the present disclosure are not limited thereto. The second flexible circuit board 50 may also be connected at any position of the second circuit board 30, and embodiments of the disclosure are not limited thereto.

Figure 2:
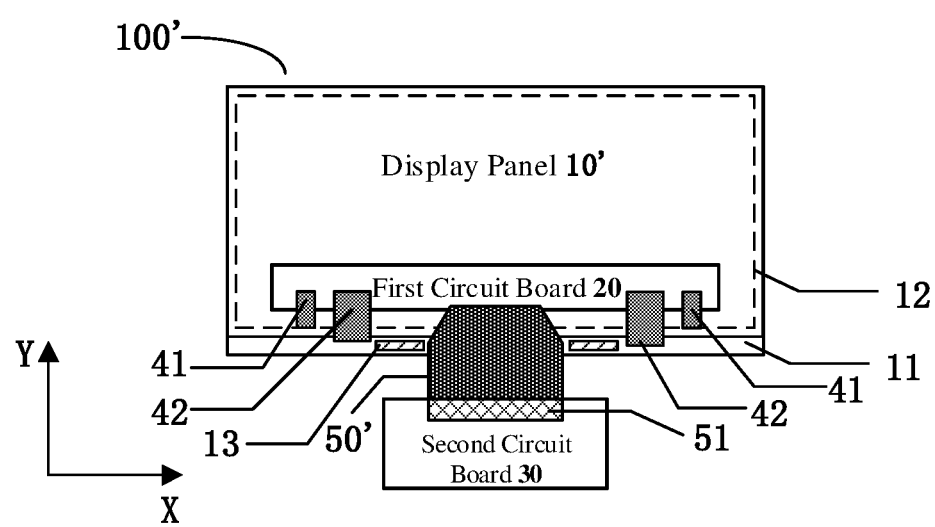
FIG. 2 is a schematic structural diagram of a display device according to at least one embodiment of the present disclosure.

FIG. 2 is a schematic structural diagram of a display device according to at least one embodiment of the present disclosure. As shown in FIG. 2, in a display device 100' according to at least one embodiment of the present disclosure, a display panel 10' may include a wiring region 11. A drive circuit 13 may be disposed in the wiring region 11, the drive circuit 13 may be, for example, a scan drive circuit and/or a data drive circuit, and for example, in the case where the display panel 10 ' is a liquid crystal display panel or an electronic paper display panel, the display panel 10' may further include a backlight 12 to provide a light source for display, and the backlight 12 may be of various types, for example, an edge-lit type or a direct type, which is not limited in the embodiments of the present disclosure. The first flexible printed circuit 40 may include a first sub-flexible printed circuit 41 and a second sub-flexible printed circuit 42. The first sub-flexible printed circuit 41 may be configured to electrically connect the backlight 12 of the display panel 10' to the first circuit board 20, and the second sub-flexible printed circuit 42 may be configured to electrically connect the drive circuit 13 (scan drive circuit and/or data drive circuit) of the display panel 10' to the first circuit board 20. The first sub-flexible printed circuit 41 and the second sub-flexible printed circuit 42 may be electrically connected to the first circuit board 20 by means of bonding, for example. In some other embodiments, the first and second sub-flexible printed circuits 41 and 42 may be adhered to the first circuit board 20 by an anisotropic conductive adhesive. However, it should be understood that embodiments of the present disclosure are not limited thereto. Further, it should be understood that although it is shown in FIG. 2 that the first flexible printed circuit 40 includes the first and second sub-flexible printed circuits 41 and 42 which are separated from each other, in other embodiments, the first and second sub-flexible printed circuits 41 and 42 may be integrally formed, and embodiments of the present disclosure are not limited thereto.

In some embodiments, the first circuit board 20 may be a non-flexible circuit board. For example, the first circuit board 20 may be a rigid circuit board. In the case where the first circuit board 20 is a non-flexible circuit board, it is possible to avoid formation of a flexible circuit board-flexible circuit board connection between the first flexible printed circuit 40 and the first circuit board 20, so that the attachment accuracy may be improved, and the requirement for the apparatus accuracy is reduced.

In some embodiments, the first circuit board 20 may have a multi-layer structure. For example, the first circuit board 20 may be a printed circuit board having 2 layers, which is not limited in the embodiments of the present disclosure.

In some embodiments, the first circuit board 20 may be electrically connected to the second circuit board 30 by a second flexible printed circuit 50'. However, it should be understood that embodiments of the present disclosure are not limited thereto. For example, in some embodiments, the first circuit board 20 may be electrically connected to the second circuit board 30 by wires. Similar to the above, in some embodiments, the second flexible printed circuit 50' may be connected or adhered to the first and second circuit boards 20 and 30 by means of bonding or an anisotropic conductive adhesive.

Although it is shown in FIG. 1 that the first circuit board 20 is electrically connected to the second circuit board 30 by one second flexible printed circuit 50', it should be understood that the first circuit board 20 may also be electrically connected to the second circuit board 30 by two or more second flexible printed circuits 50', which is not limited in the embodiment of the present disclosure.

In the case where the first circuit board 20 is a non-flexible circuit board, it is possible to avoid formation of a flexible circuit board-flexible circuit board connection between the second flexible printed circuit 50' and the first circuit board 20, so that the attachment accuracy may be improved, and the requirement for the apparatus accuracy is reduced. Similarly, in some embodiments, the second circuit board 30 may also be a non-flexible circuit board. For example, the second circuit board 30 may be a rigid circuit board. In the case where the second circuit board 30 is a non-flexible circuit board, it is possible to avoid formation of a flexible circuit board-flexible circuit board connection between the second flexible printed circuit 50' and the second circuit board 30, so that the attachment accuracy may be improved, and the requirement for the apparatus accuracy is reduced. In addition, when the second circuit board 30 is a non-flexible circuit board, the thermal expansion coefficient of the second circuit board 30 and various functional circuits disposed thereon are not greatly different from each other, so that the problems of instability, low manufacturing yield, or the like, caused by the large difference in thermal expansion coefficient may be avoided.

Figure 3:
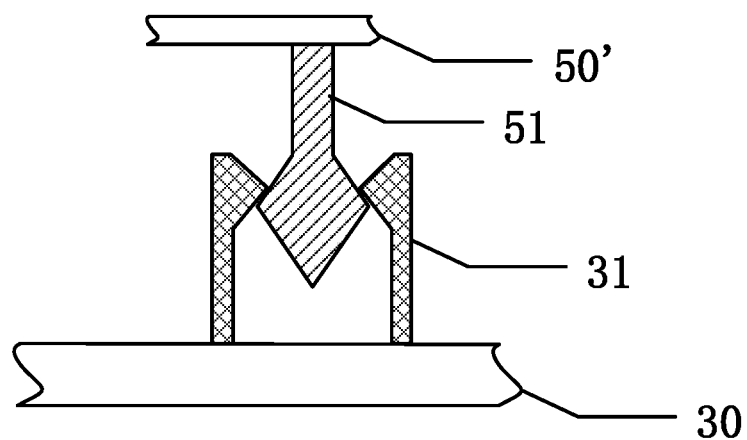
FIG. 3 is a schematic diagram of a second flexible printed circuit board of a display device according to at least one embodiment of the present disclosure being connected to a second circuit board by a snap-on connector.

In some embodiments, the second flexible printed circuit 50' may further include a connector 51, and the second flexible printed circuit 50' is electrically connected to the second circuit board 30 by the connector 51. The connector 51 may be a snap-on connector, and is snapped to the second circuit board 30. In the case where the connector 51 is a snap-on connector, the second circuit board 30 may be provided with a socket which mates with the connector 51. The second flexible printed circuit 50 is snapped to the second circuit board 30, which may improve the stability of the connection between the second flexible printed circuit 50' and the second circuit board 30, and may avoid the problem that the electronic apparatus including the display device may fall off due to the bonding connection when folded. FIG. 3 shows a schematic diagram of a connector 51 of a second flexible printed circuit board 50' and a socket 31 of a second circuit board 30 according to at least one embodiment of the present disclosure.

Figure 4:
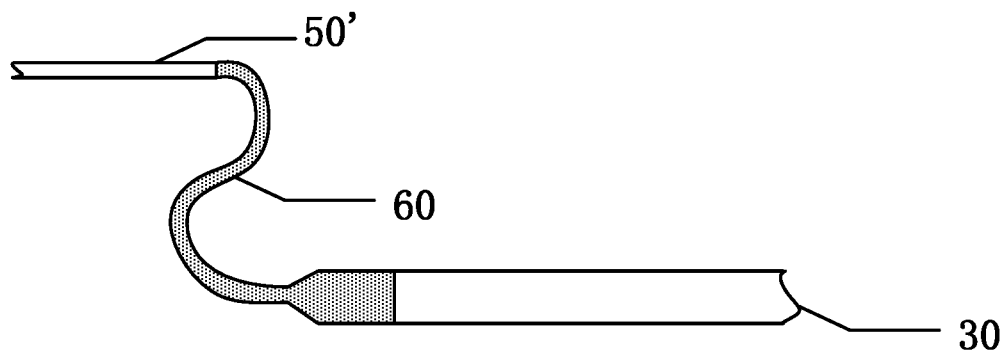
FIG. 4 is a schematic diagram of the second flexible printed circuit board of the display device according to at least one embodiment of the present disclosure being connected to the second circuit board by a rigid-flex board.

In some other embodiments, as shown in FIG. 4, the display device 100' further includes a rigid-flex board 60, and the second flexible printed circuit 50' may also be connected to the second circuit board 30 by the rigid-flex board 60. However, it should be understood that embodiments of the present disclosure are not limited thereto. The rigid-flex board mentioned here refers to a circuit board with characteristics of the flexible circuit board and the printed circuit board, which is formed by combining a flexible circuit board and a rigid circuit board by pressing, or the like, according to relevant process requirements.

Figure 5:
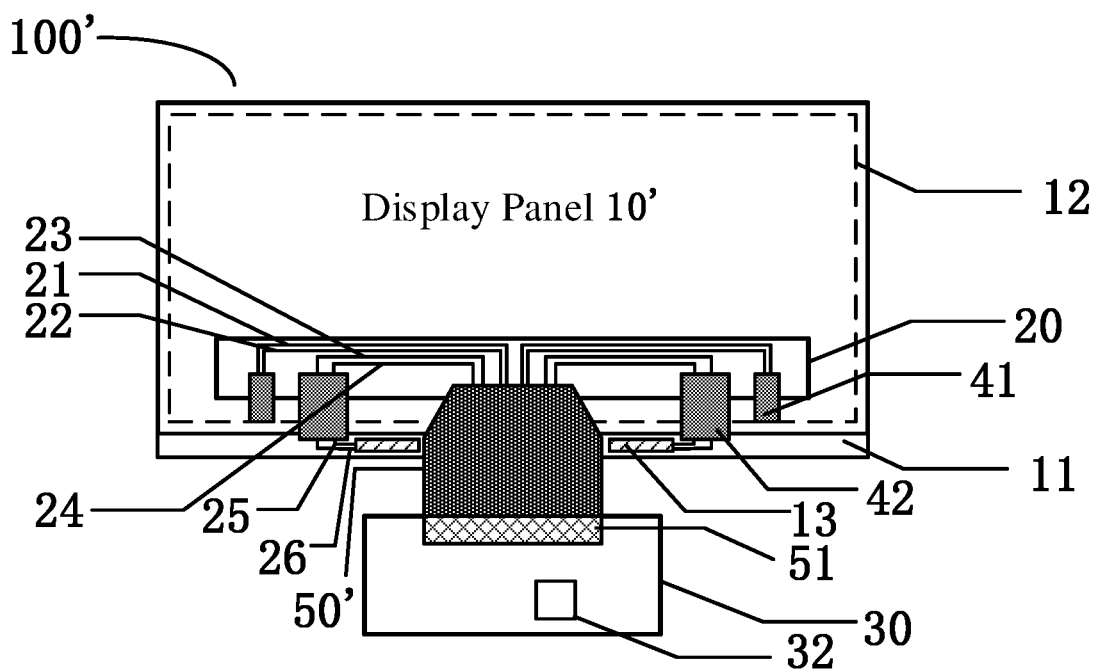
FIG. 5 is a schematic wiring diagram of a display device according to at least one embodiment of the present disclosure.

FIG. 5 is a schematic wiring diagram of a display device according to some embodiments of the present disclosure. The display device shown in FIG. 5 is, for example, the display device 100' shown in FIG. 2. The wire lines of the backlight 12 and the drive circuit 13 of the display panel 10' collect at the second flexible printed circuit 50' and are electrically connected to the second circuit board 30 by the second flexible printed circuit 50', so that the backlight 12 and the drive circuit 13 of the display panel 10' are in signal connection with the functional circuit 32 of the second circuit board 30. As shown in FIG. 5, in some embodiments, the first circuit board 20 may include a first wire 21 and a second wire 22 connected between the second flexible printed circuit 50' and the first sub-flexible printed circuit 41. The first wire 21 and the second wire 22 may be, for example, a power supply wire and a signal transmission wire for the backlight 12 of the display panel 10', respectively. The second circuit board 30 is electrically connected to the backlight 12 of the display panel 10' via the second flexible printed circuit 50', the first and second wires 21 and 22 in the first circuit board 20, and the first sub-flexible printed circuit 41.

The first circuit board 20 may further include a third wire 23 and a fourth wire 24 connected between the second flexible printed circuit 50' and the second sub-flexible printed circuit 42. In addition, the wiring region 11 of the display panel 10 may further include fifth and sixth wires 25 and 26 connected between the second sub-flexible printed circuit 42 and the drive circuit 13 of the display panel 10'. The third and fifth wires 23 and 25 may be, for example, power supply wires for the drive circuit 13 of the display panel 10', and the fourth and sixth wires 24 and 26 may be, for example, signal transmission wires for the drive circuit 13 of the display panel 10'. The functional circuit 32 of the second circuit board 30 is electrically connected to the drive circuit 13 of the display panel 10' via the second flexible printed circuit 50', the third and fourth wires 23 and 24 in the first circuit board 20, the second sub-flexible printed circuit 42, and the fifth and sixth wires 25 and 26 in the wiring region of the display panel 10'. However, it should be understood that the shape, number, etc. of the wires in the first circuit board 20 and the display panel 10' are not limited in embodiments of the present disclosure.

In some embodiments, the above-mentioned first wire 21, second wire 22, third wire 23, and fourth wire 24 are formed on the first circuit board 20 in any suitable manner, such as on the surface of the circuit board, or in the circuit board and led out through via holes, for example.

In the display device according to the embodiments of the present disclosure, the bezel of the display device may be narrowed without increasing the thickness of the display device, thereby realizing the ultra-thin and ultra-narrow design of the display device.

At least one embodiment of the present disclosure further provides an electronic apparatus including the display device according to any one of the above-mentioned embodiments. For example, the electronic apparatus may be any product or component with a display function, such as a liquid crystal television, a display, an OLED television, an electronic paper display device, a mobile phone, a tablet computer, a notebook computer, a digital photo frame, a navigator, or the like.

Figure 6:
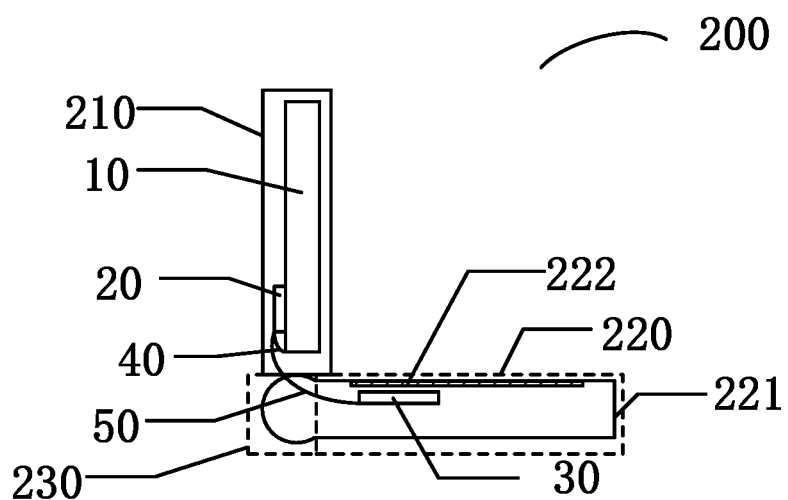
FIG. 6 is a schematic structural diagram of an electronic apparatus according to at least one embodiment of the present disclosure.

FIG. 6 shows a schematic structural diagram of an electronic apparatus according to at least one embodiment of the present disclosure. As shown in FIG. 6, an electronic apparatus 200 according to at least one embodiment of the present disclosure includes a first main body 210 and a second main body 220 connected to each other. In some embodiments, the first main body 210 and the second main body 220 are pivotably connected to each other. For example, the first main body 210 and the second main body 220 may be connected by a hinge therebetween. However, it should be understood that embodiments of the present disclosure are not limited thereto.

The electronic apparatus 200 includes, for example, the above-mentioned display device 100 as shown in FIG. 1, in which the display panel 10 and the first circuit board 20 are located in the first main body 210, and the first circuit board 20 is positioned at the non-light-outgoing side of the display panel 10; the second circuit board 30 is located in the second main body 220. For example, the electronic apparatus 200 may be a notebook computer, the display device 100 may be configured as a display screen of the notebook computer, and the second circuit board 30 may be located in a host casing 221 of the notebook computer and stacked with a keyboard 222 of the notebook computer.

In some embodiments, the electronic apparatus 200 further includes a connection part 230 hinged with the first main body 210, and the second flexible printed circuit 50 connecting the first and second circuit boards 20 and 30 may extend through the connection part 230. It should be understood that although it is shown in FIG. 6 that the connection part 230 is hinged to the first main body 210, in other embodiments, the connection part 230 may be hinged to the second main body 220, or the connection part 230 may be hinged to both the first main body 210 and the second main body 220, which is not limited in the embodiments of the present disclosure.

In some embodiments, the first circuit board 20 positioned at the non-light-outgoing side of the display panel 10 may be fixed to the display panel 10 or to the first main body 210. In some other embodiments, the first circuit board 20 may be fixed with both the display panel 10 and the first main body 210, which is not limited in the embodiments of the present disclosure.

At least one embodiment of the present disclosure also provides a method of manufacturing a display device, which may be applied to the display device according to any one of the embodiments of the present disclosure.

Figure 7:
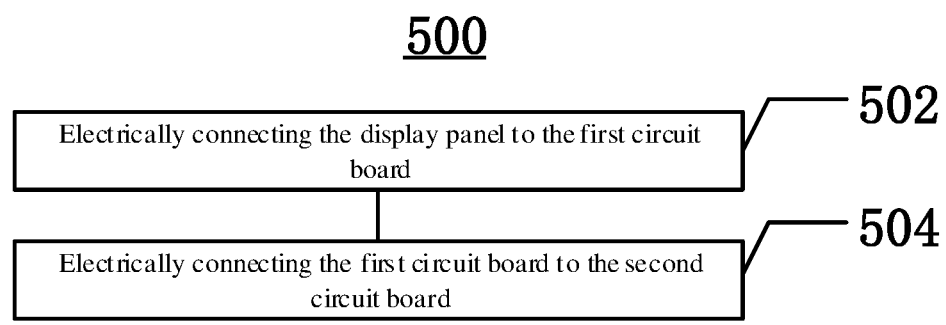
FIG. 7 is a flow chart of a method of manufacturing a display device according to at least one embodiment of the present disclosure.

As shown in FIG. 7, a method 500 of manufacturing a display device according to at least one embodiment of the present disclosure includes:

S502, electrically connecting a display panel to a first circuit board, wherein the display panel includes a light-outgoing side and a non-light-outgoing side opposite to the light-outgoing side, and the first circuit board is positioned at the non-light-outgoing side; and S504, electrically connecting the first circuit board to a second circuit board, wherein the second circuit board includes a functional circuit in signal connection with the display panel.

In some embodiments, the first circuit board may be electrically connected to the display panel by, for example, at least one of a wire(s) and a flexible printed circuit.

In the case where the first circuit board is electrically connected to the display panel by the flexible printed circuit, the step S502 may include:

electrically connecting the display panel to the first flexible printed circuit by bonding; and electrically connecting the first circuit board to the first flexible printed circuit by bonding.

However, it should be understood that embodiments of the present disclosure are not limited thereto. For example, in some other embodiments, the display panel and the first flexible printed circuit and the first circuit board and the first flexible printed circuit may be adhered by an anisotropic conductive adhesive.

In some embodiments, the second circuit board may be electrically connected to the first circuit board by, for example, at least one of a wire and a flexible printed circuit.

In the case where the second circuit board is electrically connected to the first circuit board by the flexible printed circuit, the step S504 may include:

electrically connecting the first circuit board to the second flexible printed circuit by bonding; and electrically connecting the second circuit board to the second flexible printed circuit by snapping or a rigid-flex board(s).

However, it should be understood that embodiments of the present disclosure are not limited thereto. For example, in some other embodiments, the first circuit board and the second flexible printed circuit and the second circuit board and the second flexible printed circuit may be adhered by an anisotropic conductive adhesive, or the second circuit board and the second flexible printed circuit may be connected by bonding.

For detailed descriptions of components (such as the display panel, the first circuit board, the second circuit board, the first flexible printed circuit, the second flexible printed circuit, or the like) in the display device, reference may be made to the above description of the embodiments, and details thereof will not be repeated herein.

At least one embodiment of the present disclosure also provides a method of operating a display device, which is adapted for the display device according to any one of the embodiments of the present disclosure. The method of operating a display device may include: transferring signals between the functional circuit of the second circuit board and the display panel via the first circuit board.

The above are related to merely exemplary embodiments of the present disclosure and are not intended to limit the scope of the present disclosure, and the scope of the present disclosure is determined by the appended claims.

What is claimed is:

1. A display device, comprising:
a display panel, comprising a light-outgoing side and a non-light-outgoing side opposite to the light-outgoing side;
a first circuit board, electrically connected to the display panel and positioned at the non-light-outgoing side; and
a second circuit board, configured to be electrically connected to the first circuit board, and the second circuit board comprising a functional circuit in signal connection with the display panel,
the display device further comprising a flexible printed circuit board configured to electrically connect the first circuit board to at least one selected from a group consisting of:
the display panel; and
the second circuit board, wherein the flexible printed circuit board comprises a first flexible printed circuit board, the first flexible printed circuit board comprises a first sub-flexible printed circuit board and a second sub-flexible printed circuit board,
the first sub-flexible printed circuit board is configured to electrically connect a backlight of the display panel to the first circuit board, and
the second sub-flexible printed circuit board is configured to electrically connect a drive circuit of the display panel to the first circuit board.

2. The display device according to claim 1, wherein the first circuit board is configured to provide only an electrical connection between the display panel and the second circuit board and to have no signal processing capability.

3. The display device according to claim 2, wherein the display device comprises a backlight and a drive circuit, and at least one selected from a group consisting of the backlight and the drive circuit of the display device is electrically connected to the first circuit board.

4. The display device according to claim 1, wherein the display device comprises a backlight and a drive circuit, and at least one selected from a group consisting of the backlight and the drive circuit of the display device is electrically connected to the first circuit board.

5. The display device according to claim 1, wherein at least one selected from a group consisting of the first circuit board and the second circuit board is a non-flexible circuit board.

6. The display device according to claim 5, wherein the first circuit board is a non-flexible circuit board having a multi-layer structure.

7. The display device according to claim 5, wherein the first circuit board is a non-flexible circuit board having a thickness less than 1 mm.

8. The display device according to claim 1, wherein the flexible printed circuit board further comprises a second flexible printed circuit board configured to electrically connect the first circuit board to the second circuit board,
the second flexible printed circuit board comprises a snap-on connector and the second circuit board comprises a socket, and the snap-on connector mates with the socket to electrically connect the first circuit board to the second circuit board.

9. The display device according to claim 8, wherein the first circuit board comprises a first wire and a second wire, the first wire and the second wire are configured to be connected between the first sub-flexible printed circuit board and the second flexible printed circuit board, and the first wire and the second wire are a power supply wire and a signal transmission wire for a backlight of the display panel respectively,
- the first circuit board further comprises a third wire and a fourth wire, the third wire and the fourth wire are configured to be connected between the second sub-flexible printed circuit board and the second flexible printed circuit board, and
- the display panel comprises a fifth wire and a sixth wire, the fifth wire and the sixth wire are configured to be connected between the second sub-flexible printed circuit board and the drive circuit of the display panel, the third wire and the fifth wire are power supply wires for the drive circuit of the display panel, and the fourth wire and the sixth wire are signal transmission wires for the drive circuit of the display panel.

10. The display device according to claim 1, wherein the flexible printed circuit board further comprises a second flexible printed circuit board configured to electrically connect the first circuit board to the second circuit board, and
- the display device further comprises a rigid-flex board configured to electrically connect the second circuit board to the second flexible printed circuit.

11. The display device according to claim 1, wherein the functional circuit comprises at least one selected from a group consisting of an interface circuit, a power circuit and a signal processing circuit.

12. An electronic apparatus, comprising a display device, the display device comprising:
- a display panel, comprising a light-outgoing side and a non-light-outgoing side opposite to the light-outgoing side;
- a first circuit board, electrically connected to the display panel and positioned at the non- light-outgoing side; and
- a second circuit board, configured to be electrically connected to the first circuit board, and the second circuit board comprising a functional circuit in signal connection with the display panel,
- the display device further comprising a flexible printed circuit board configured to electrically connect the first circuit board to at least one selected from a group consisting of:
- the display panel; and
- the second circuit board, wherein
- the flexible printed circuit board comprises a first flexible printed circuit board, the first flexible printed circuit board comprises a first sub-flexible printed circuit board and a second sub-flexible printed circuit board,
- the first sub-flexible printed circuit board is configured to electrically connect a backlight of the display panel to the first circuit board, and
- the second sub-flexible printed circuit board is configured to electrically connect a drive circuit of the display panel to the first circuit board.

13. The electronic apparatus according to claim 12, wherein
- the electronic apparatus comprises a first main body and a second main body connected to each other, and
- the first circuit board is in the first main body, and the second circuit board is in the second main body.

14. The electronic apparatus according to claim 13, wherein the first main body and the second main body are pivotably connected.

15. The electronic apparatus according to claim 12, further comprising a connection part hinged to at least one selected from a group consisting of the first main body and the second main body, the first circuit board and the second circuit board being connected to each other via the connection part.

16. The electronic apparatus according to claim 12, wherein the electronic apparatus is a notebook computer, the display device functions as a display screen of the notebook computer, and the second circuit board is inside a host casing of the notebook computer and laminated with a keyboard of the notebook computer.

* * * * *